US011133785B2

(12) United States Patent
Lee

(10) Patent No.: US 11,133,785 B2
(45) Date of Patent: Sep. 28, 2021

(54) DIGITAL-TO-ANALOG CONVERTER AND AMPLIFIER FOR HEADPHONES

(71) Applicant: Avnera Corporation, Hillsboro, OR (US)

(72) Inventor: Wai Laing Lee, Portland, OR (US)

(73) Assignee: AVNERA CORPORATION, Hillsboro, OR (US)

( * ) Notice: Subject to any disclaimer, the term of this patent is extended or adjusted under 35 U.S.C. 154(b) by 0 days.

(21) Appl. No.: 16/648,621

(22) PCT Filed: Sep. 20, 2018

(86) PCT No.: PCT/US2018/051979
§ 371 (c)(1),
(2) Date: Mar. 18, 2020

(87) PCT Pub. No.: WO2019/060565
PCT Pub. Date: Mar. 28, 2019

(65) Prior Publication Data
US 2020/0228076 A1 Jul. 16, 2020

Related U.S. Application Data

(60) Provisional application No. 62/561,586, filed on Sep. 21, 2017.

(51) Int. Cl.
*H03F 3/217* (2006.01)
*H03F 3/187* (2006.01)
(Continued)

(52) U.S. Cl.
CPC ........... *H03F 3/2175* (2013.01); *H03F 3/187* (2013.01); *H03M 1/46* (2013.01); *H03M 1/504* (2013.01);
(Continued)

(58) Field of Classification Search
None
See application file for complete search history.

(56) References Cited

U.S. PATENT DOCUMENTS 6,014,055 A * 1/2000 Chester ................. H03F 3/2175
330/10
7,920,082 B2 4/2011 Kawai et al.
(Continued)

FOREIGN PATENT DOCUMENTS

EP 2159918 A2 3/2010
TW 201010289 A 3/2010

OTHER PUBLICATIONS

International Search Report and Written Opinion of the International Search Authority issued in International Application No. PCT/US2018/051979, dated Dec. 19, 2018 (13 pages).

*Primary Examiner* — Qin Zhu
(74) *Attorney, Agent, or Firm* — Lando & Anastasi, LLP

(57) ABSTRACT

An amplifier for headphones including a current digital-to-analog converter (DAC) configured to output a current based on a digital audio input signal, an output electrically connected to a speaker and configured to output an output signal to the speaker, and a pulse width modulation (PWM) loop configured to receive an error signal, the error signal based on a difference between the current from the current DAC and a current of the output signal, and generate the output signal based on the error signal. The PWM loop includes an analog-to-digital converter (ADC) configured to receive an analog signal based on the current from the current DAC and output a digital signal representing the analog signal, and an encoder configured to receive the digital signal and output a pulse having a width based on the analog signal.

21 Claims, 7 Drawing Sheets

(51) Int. Cl.
  *H03M 1/46* (2006.01)
  *H03M 1/50* (2006.01)
  *H03M 1/82* (2006.01)
  *H04R 3/00* (2006.01)
  *H03F 3/45* (2006.01)
  *H03M 3/00* (2006.01)

(52) U.S. Cl.
  CPC .............. *H03M 1/822* (2013.01); *H04R 3/00* (2013.01); *H03F 2200/03* (2013.01); *H03F 2200/345* (2013.01); *H03F 2200/351* (2013.01)

(56) References Cited

U.S. PATENT DOCUMENTS

| | | | |
|---|---|---|---|
| 9,319,011 B2 | 4/2016 | Kinyua et al. | |
| 9,356,613 B1 | 5/2016 | Kris | |
| 10,418,954 B1 * | 9/2019 | Price | H03F 1/301 |
| | | | 330/251 |
| 10,542,361 B1 * | 1/2020 | Lazar | H04R 3/007 |
| 2004/0174286 A1 * | 9/2004 | Donovan | H03M 1/68 |
| | | | 341/145 |
| 2005/0231410 A1 * | 10/2005 | Lee | H03M 3/506 |
| | | | 341/144 |
| 2006/0202754 A1 | 9/2006 | Yamamura et al. | |
| 2008/0272842 A1 | 11/2008 | Lee et al. | |
| 2009/0315623 A1 | 12/2009 | Dooper et al. | |
| 2011/0187566 A1 | 8/2011 | Soenen et al. | |
| 2012/0275493 A1 | 11/2012 | Fortier et al. | |
| 2013/0049855 A1 * | 2/2013 | Berkhout | H03F 3/2173 |
| | | | 330/2 |
| 2013/0127530 A1 | 5/2013 | Ni et al. | |
| 2015/0381119 A1 * | 12/2015 | Lu | H03F 3/45475 |
| | | | 330/251 |
| 2016/0141957 A1 * | 5/2016 | Ozawa | H02M 3/156 |
| | | | 323/271 |
| 2016/0294326 A1 * | 10/2016 | Jorritsma | H03F 1/0205 |
| 2018/0020288 A1 * | 1/2018 | Risbo | H03F 3/3022 |

\* cited by examiner

DIGITAL-TO-ANALOG CONVERTER AND AMPLIFIER FOR HEADPHONES

CROSS-REFERENCE TO RELATED APPLICATIONS

This application is a national stage filing under 35 U.S.C. § 371 of International Application No. PCT/US2018/051979, filed Sep. 20, 2018, entitled "DIGITAL-TO-ANALOG CONVERTER AND AMPLIFIER FOR HEADPHONES," and claims priority from U.S. Provisional Patent Application No. 62/561,586, filed Sep. 21, 2017, the disclosures of both of which are incorporated herein by reference in their entirety.

FIELD OF THE INVENTION

This disclosure is directed to systems and methods related to amplifiers for use in headphones, and in particular, to switching amplifiers having a pulse width modulation (PWM) loop.

BACKGROUND

Headphones generally include amplifiers that have lower power consumption, such as a class AB amplifier, which provides efficiency and linearity. Class AB amplifiers are not always preferred in headphones and sometimes class D, or switching, amplifiers may be used. Class D amplifiers, however, often cannot meet the audio performance requirements that class AB amplifiers meet.

Class D, or switching, amplifiers work by generating a number of pulses by a modulator of fixed amplitude but varying width and separation, or varying number per unit time, representing the amplitude variations of an analog audio input signal. Conventionally, the modulator compares analog voltages against a particular waveform, usually a triangular waveform, to decide how wide a pulse of a digital signal should be. The output of the modulator is then used to gate output transistors on and off alternately to use as the signal for the headphone speakers. A low-pass filter may be used to provide a path for the low-frequencies of the audio signal, leaving the high-frequency pulses behind, to output to speakers of the headphones.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is an amplifier to convert digital audio data to a speaker signal, using a class D or switching amplifier, which may be used, for example, in headphones. The amplifier includes a current digital-to-analog converter (DAC) configured to output a current based on a digital audio input signal, an output electrically connected to a speaker and configured to output an output signal to the speaker, and a pulse width modulation (PWM) loop configured to receive an error signal, the error signal based on a difference between the current from the current DAC and a current of the output signal, and generate the output signal based on the error signal. Rather than using conventional techniques of processing data in analog form, the PWM loop processes the data in digital form using a analog-to-digital converter (ADC) configured to receive an analog signal based on the current from the current DAC and output a digital signal representing the analog signal and an encoder configured to receive the digital signal and output a pulse having a width based on the analog signal.

Figure 1:
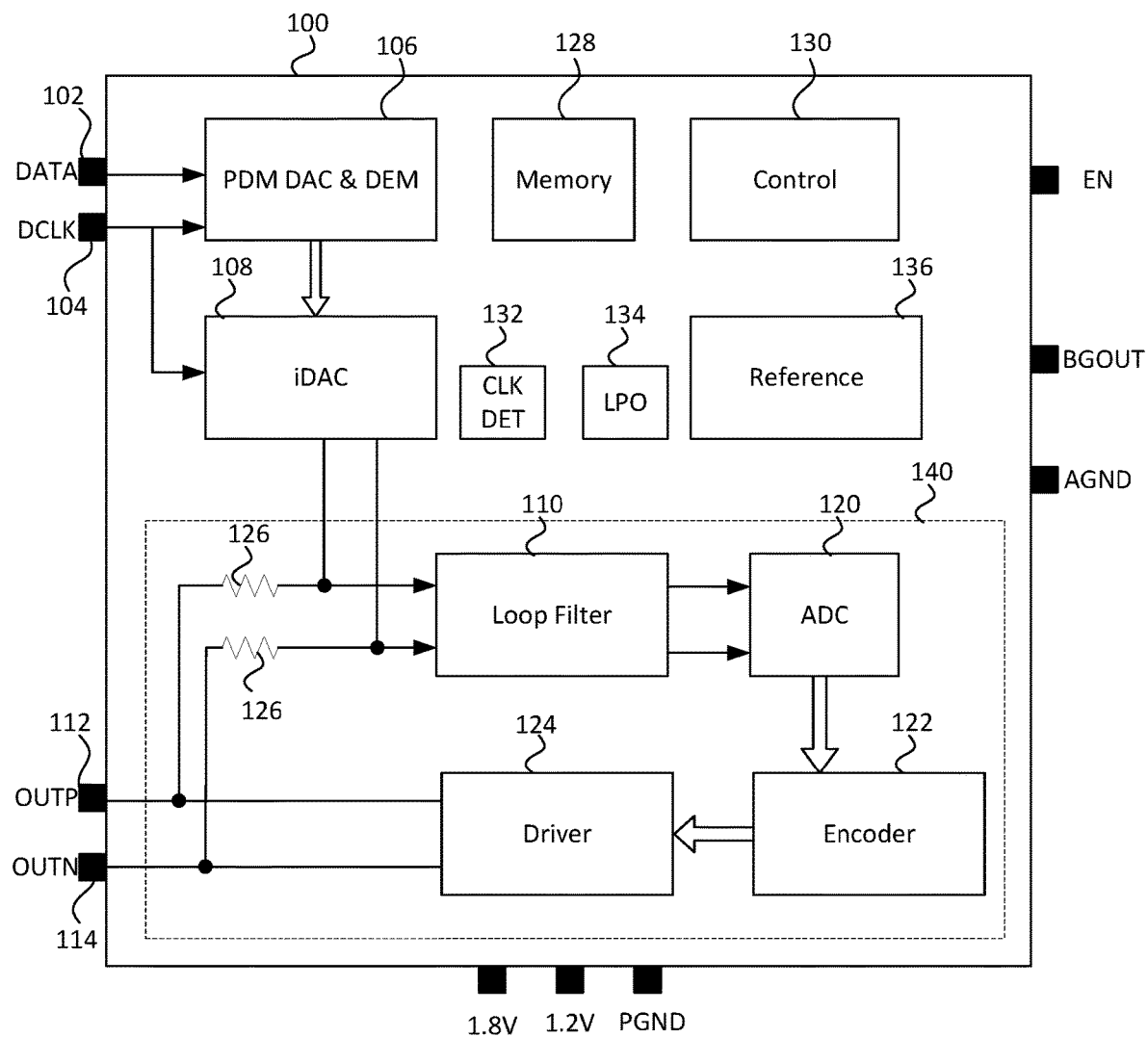
FIG. 1 is a block diagram of an amplifier according to embodiments of the disclosure.

FIG. 1 is a block diagram of an amplifier 100 according to embodiments of the disclosure, which may be used in headphones. In some embodiments, the amplifier 100 may include a class D, or switching, amplifier that may provide a lower power to operate and provide an efficient driving signal for the headphone speakers. The amplifier 100 can receive a digital signal related to media content and convert the digital signal to an analog signal to output to headphone speakers.

As seen in FIG. 1, the amplifier 100 receives digital data at a digital data input 102, as well as a clock signal received at an input 104. Both the data and the clock signal can be received by a pulse density modulation (PDM) DAC with digital dynamic element matching (DEM) 106, which may be referred to herein as PDM DAC 106. The output from the PDM DAC 106 is sent to a current DAC 108. The current DAC 108 also receives the clock signal from input 104. The output from the current DAC 108 is sent to a pulse width modulation (PWM) loop 140, which is a switching amplifier that includes a loop filter 110, an analog-to-digital converter (ADC) 120, an encoder 122, and a driver 124. A filtered signal from the loop filter 110 is sent to ADC 120, which in some embodiments may be a successive approximation register (SAR) ADC, as will be discussed in more detail below. The pulse width modulation (PWM) encoder 122 receives a digital signal from the ADC 120 and an output from the PWM encoder 122 is received at a driver 124. A differential output of the driver 124 is also received at outputs 112 and 114, which are connected to speakers of the headphones. The driver 124 outputs a differential pair signal, which includes a positive signal that goes to the positive output 112 and the negative signal that goes to the negative output 114.

Resistors 126 are provided to guide the output current toward the loop filter 110. The input of the loop filter 110 is then the difference between the output current and the current output from the current DAC 108, which will be discussed in more detail below.

As will be understood by one of ordinary skill in the art, the amplifier 100 may also include additional components such as a memory 128, a control 130, a clock detection 132, an LPO (low-power oscillator) 134, and a reference 136. The features of the amplifier 100, as described in more detail below, result in a low-quiescent power usage and high efficiency with load current. For example, in the embodiments discussed below, the quiescent power required for amplifier 100 is approximately 428 μW. The amplifier 100 also includes a high-power supply rejection ratio (PSRR) of about 90 dB in the examples below and includes a single gain range for 112 dB dynamic range performance. Further, the amplifier 100 enters a stand-by mode when no clock signal is present to save power.

FIGS. 2-7 below show and discuss additional details and features of some of the components of the amplifier 100 discussed above.

Figure 2:
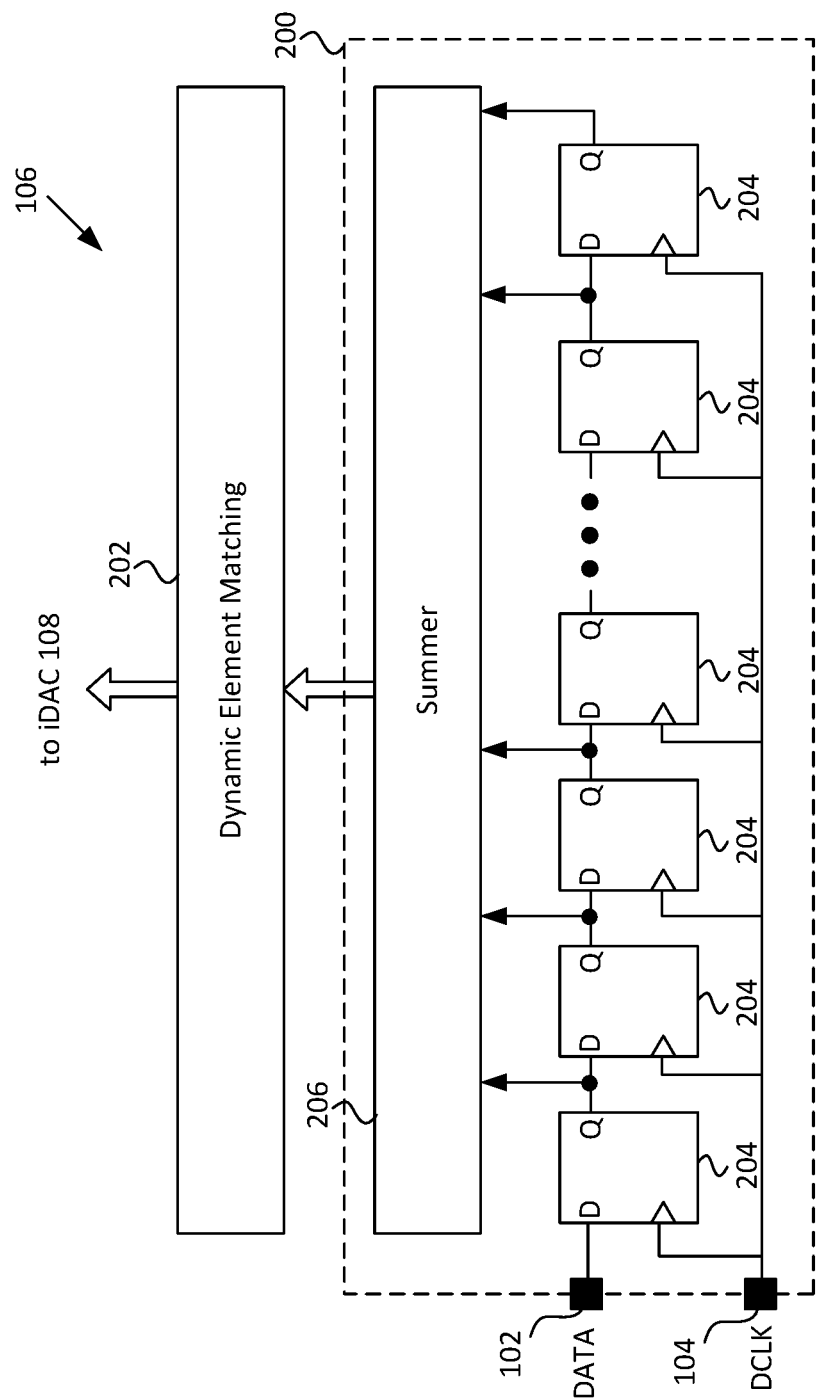
FIG. 2 is an example block diagram of a pulse density modulation digital-to-analog converter and digital dynamic element matching device of FIG. 1.

FIG. 2 illustrates an example of the PDM DAC 106 of FIG. 1, according to embodiments of the disclosure. The PDM DAC 106 includes a digital finite infinite response (FIR) filter 200 followed by a DEM logic circuit 202. The digital FIR filter 200 receives data from the data input 102, as well as the data clock at input 104. Using a number of flip flop circuits 204 and a summer 206, the FIR filter 200 attenuates out of band noise to increase clock jitter tolerance to provide a multi-bit output with a small least significant bit (LSB) output. That is, the flip flop circuits 204 of the FIR filter 200 delay the input signal and output a number of bits. The summer 206 adds all the one bit signals to output a four bit signal to the DEM logic circuit 202, which scrambles the signal going to the current DAC 108 so that imperfections of the DAC bit cells 300, discussed below, are pushed out to higher frequencies. An output of the DEM logic circuit 202 drives the current DAC 108 bit cells, as shown in FIG. 3.

Figure 3:
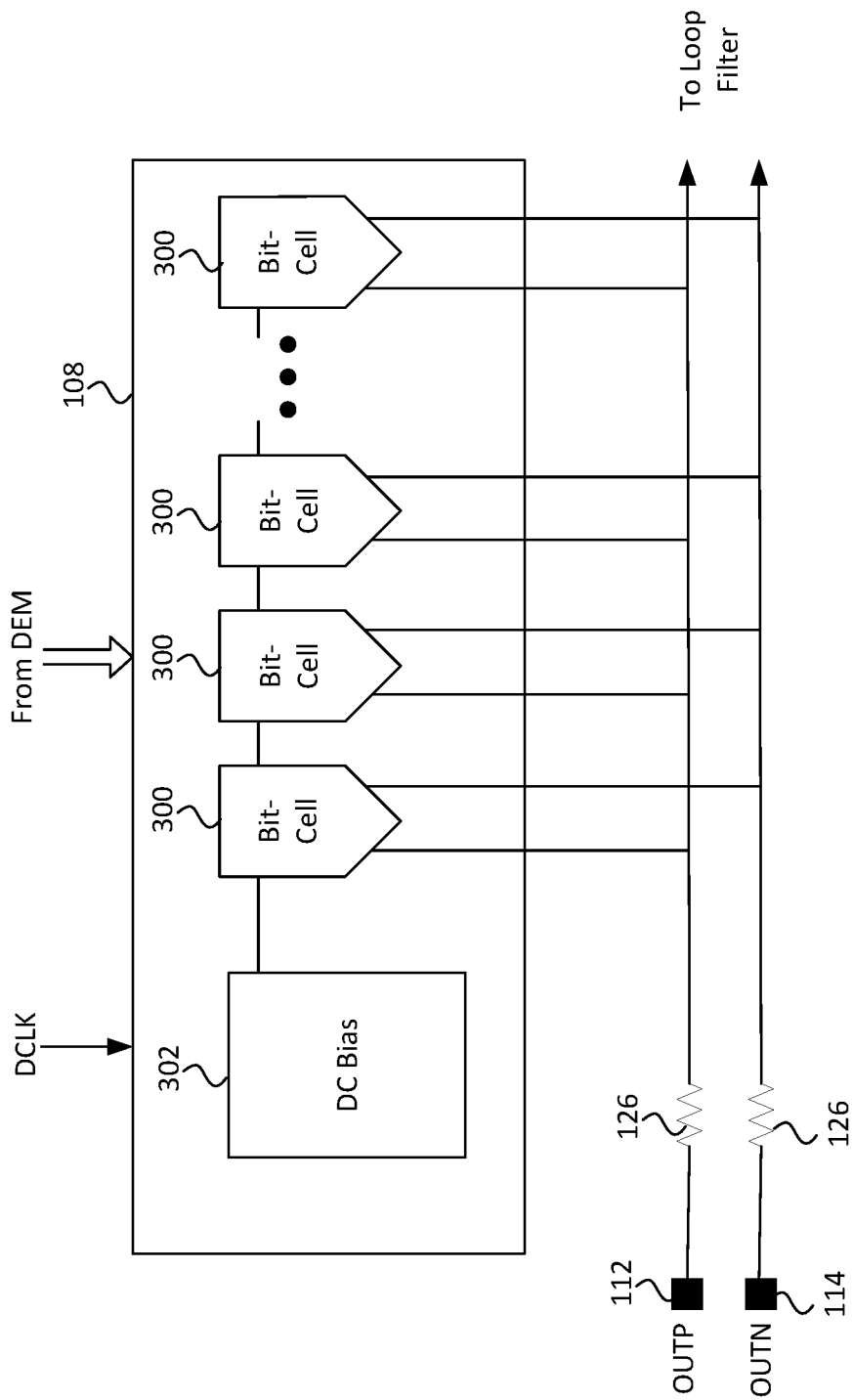
FIG. 3 is an example block diagram of a current digital-to-analog converter of FIG. 1.

FIG. 3 illustrates an example of the current DAC 108 shown in FIG. 1 according to embodiments of the disclosure. The current DAC 108 includes a number of bit cells 300 and a DAC bias 302. The current DAC 108 illustrated in FIG. 3 may include a dynamic power down function that powers down each bit-cells 300 that is not being used to save power. Any number of bit-cells 300 may be used, depending on the features of the amplifier 100. In the example of FIG. 3, eight current bit cells 300 may be enabled in the current DAC 108 at the same time. The current DAC 108 enables bit-cells 300 based on the received signal from the PDM DAC 106 and outputs a current.

Table 1, below, shows an example output of the current DAC 108, based on the received digital signal which is processed through the PDM DAC 106. In the example of table 1, each bit-cell 300 output is 55.24 μA.

TABLE 1

| Summer Output | DEM Ouput | iDAC output N bit-cells | iDAC Output μA |
|---|---|---|---|
| 0 | −16 | −8 | −441.94 |
| 1 | −14 | −7 | −386.70 |
| 2 | −12 | −6 | −331.46 |
| 3 | −10 | −5 | −276.21 |
| 4 | −8 | −4 | −220.97 |
| 5 | −6 | −3 | −165.73 |
| 6 | −4 | −2 | −110.49 |
| 7 | −2 | −1 | −55.24 |
| 8 | 0 | 0 | 0 |
| 9 | 2 | 1 | 55.24 |
| 10 | 4 | 2 | 110.49 |
| 11 | 6 | 3 | 165.73 |
| 12 | 8 | 4 | 220.97 |
| 13 | 10 | 5 | 276.21 |
| 14 | 12 | 6 | 331.46 |
| 15 | 14 | 7 | 386.70 |
| 16 | 16 | 8 | 441.94 |

Figure 4:
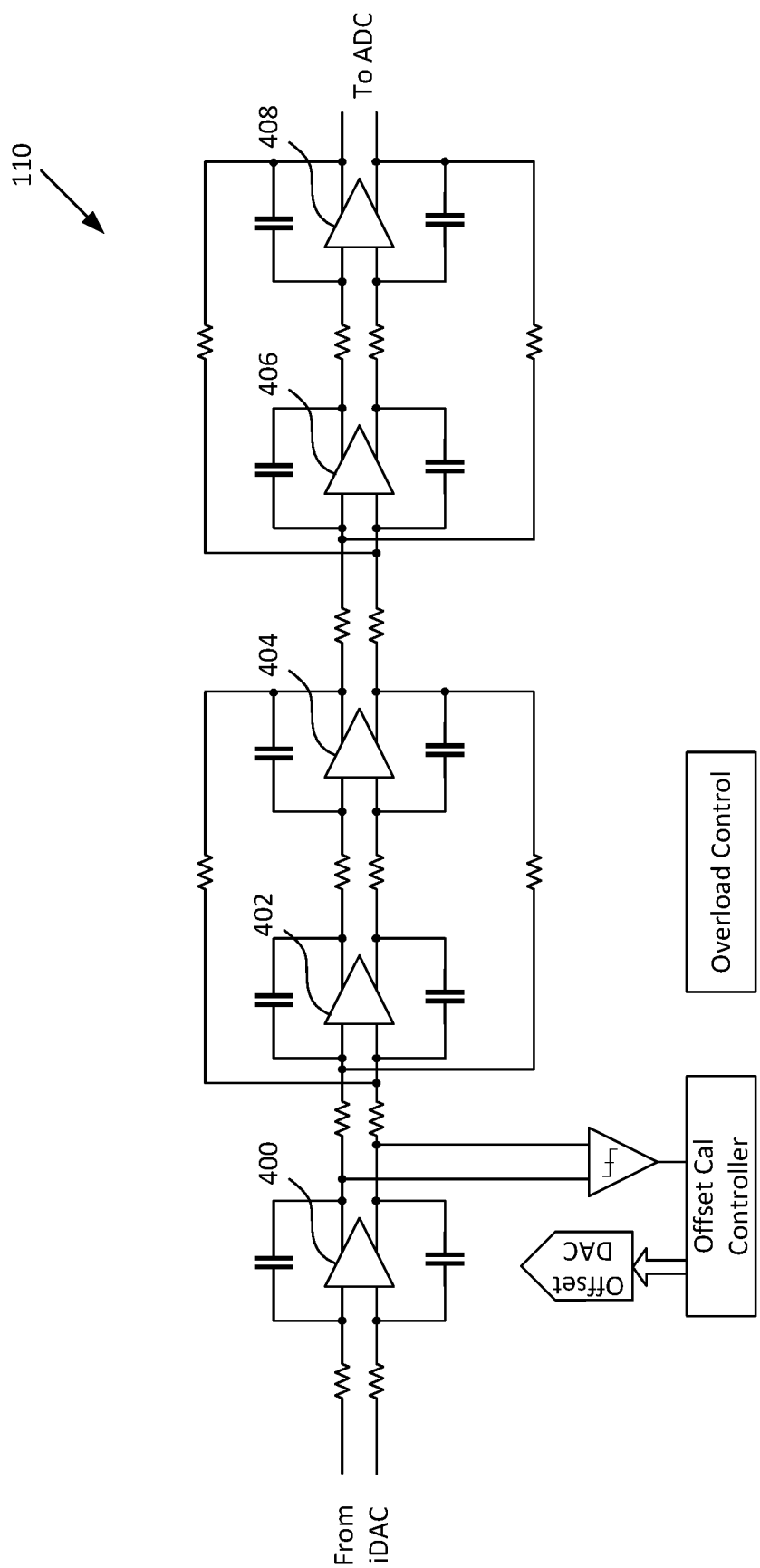
FIG. 4 is an example circuit diagram of a loop filter of FIG. 1.

As mentioned above, the input of the loop filter 110 is the current difference between the output of the current DAC 108 and the current of the output voltage through resistors 126, which convert the output voltages to currents. The loop filter 110, an example of which is illustrated in FIG. 4, is responsible for keeping the PWM loop 140 stable and locking the output of the PWM loop 140 to the input of the PWM loop 140. In FIG. 4, a $5^{th}$ order loop filter 110 is illustrated, which provides a high loop gain over the audio band to amplify the error between the output current and the current DAC 108 current. The $5^{th}$ order loop filter 110, in this embodiment, amplifies the error by approximately a thousand. However, embodiments of the disclosure are not limited to a $5^{th}$ order loop filter 110. Any loop filter which amplifies the error may be used, such as a $2^{nd}$, $3^{rd}$, or higher loop filter 110.

In the loop filter 110 of FIG. 4, the first operational amplifier 400 may be a high-order stage-1 operational amplifier, while the remaining operational amplifiers 402, 404, 406, and 408 may be low-power Class AB operational amplifiers. Offset calibration can be provided for the first operational amplifier 400. The high gain from the loop filter 110 can ensure that the output and the desired signal are very closely matched by amplifying the error between the output current and the current output by the current DAC 108.

Figure 5:
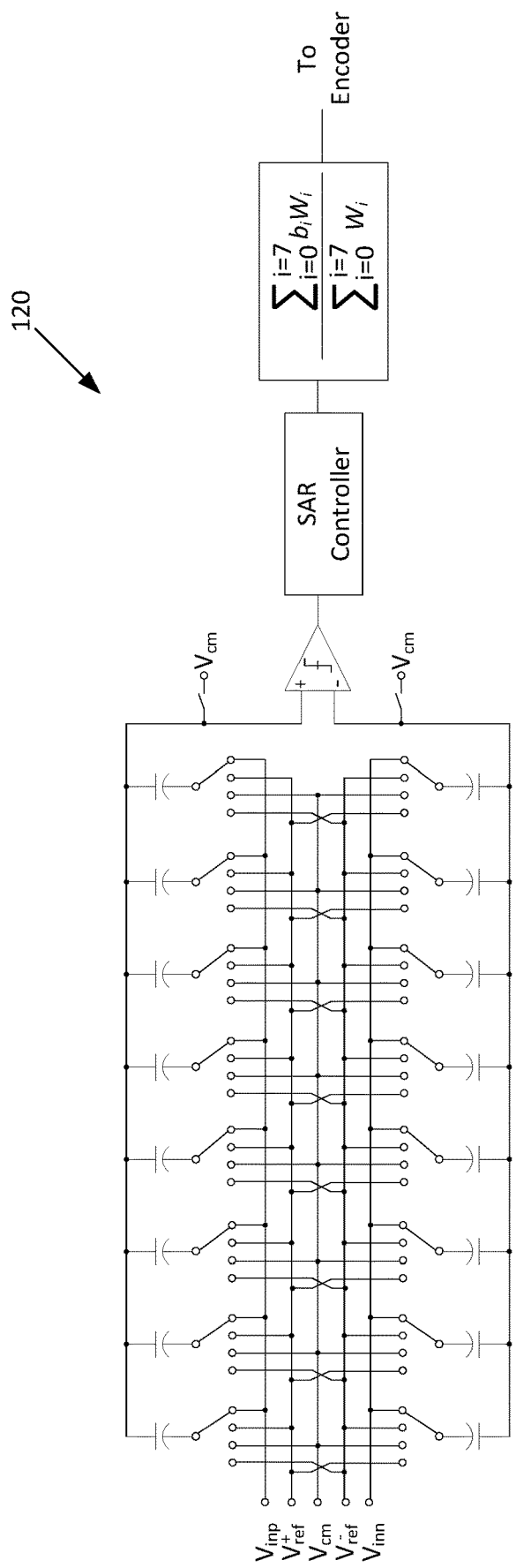
FIG. 5 is an example circuit diagram of a successive approximation register analog-to-digital converter of FIG. 1.

As illustrated in FIG. 5, the output of the loop filter 110 is received at the ADC 120. In the example of FIG. 5, a SAR ADC 120 is shown. As will be understood by one skilled in the art, the SAR ADC 120 converts the amplified error into a discrete digital representation via a binary search through all possible quantization levels before finally converging upon a digital output for each conversion. The SAR ADC 120 digitizes the output of the loop filter 110 prior to determining the pulse widths, so digital, rather than analog, techniques may be used to determine the desired output signal for the speakers. FIG. 5 illustrates an example of a SAR ADC 120, according to some embodiments of the disclosure. However, as will be understood by one skilled in the art, embodiments of the disclosure are not limited to the use of the SAR ADC 120 illustrated in FIG. 5, and other types of SAR ADCs may be used or implemented.

The SAR ADC 120 can output two early most significant bit (MSB) decisions, usually within 20 ns after sampling. These early MSB decisions can allow the PWM encoder 122 to start an edge of a pulse early for wide pulses, as illustrated in FIG. 6.

Although a SAR ADC 120 is shown in FIG. 5, embodiments of the disclosure are not limited to a SAR ADC 120. Any ADC 120 may be used to convert the amplified error into a discrete digital representation. For example, in some embodiments, a two-stage flash ADC may be used rather than a SAR ADC 120. That is, embodiments of the disclosure require any ADC that may convert the amplified error into a discrete digital representation.

Figure 6:
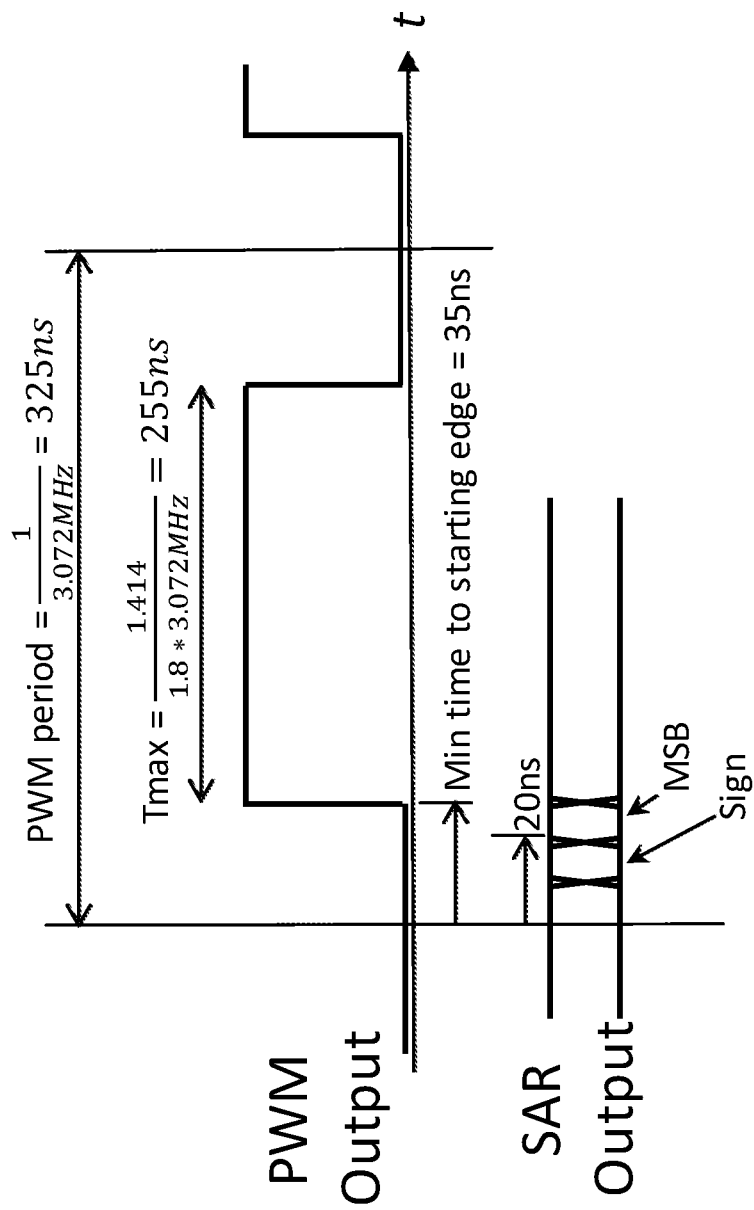
FIG. 6 is an example timing diagram for generating a pulse by the encoder of FIG. 1 based on the output of the successive approximation register analog-to-digital convert of FIG. 5.

FIG. 6 illustrates a time period for each pulse generated by the PWM encoder 122 versus the output of the SAR ADC 120 of FIG. 5. As seen in FIG. 6, the total PWM period is 325 ns and a maximum pulse width within that period can take 255 ns. The MSB from the SAR ADC 120 is output in 20 ns and all the bits are output in 100 ns. If the MSB indicates a wide pulse, then the PWM encoder 122 can begin generating the pulse as soon as the MSB is available, as the minimum time to start an edge of a maximum width pulse is 35 ns. Since all the bits are output in 100 ns from the SAR ADC 120, there is ample time after the bits are output in 100 ns to generate a small width pulse within the PWM period of 325 ns.

Further, unlike conventional switching amplifiers, where the pulses only go between high and low, the encoder 122 can also select a voltage, such as 0.1V, 0.6V, and 1.2V, based on the pulse width and the output of the ADC 120. That is, the pulses from the PWM encoder 122 can vary in height, indicating the selected voltage for that pulse. This allows for higher efficiency during switching since rather than switching between 0 and 1.2V, embodiments disclosed herein can switch between 0 and 0.1V, and then 0.1V to 0.6V or 1.2V, etc. This low output swing in switching voltage improves the overall efficiency of the amplifier 100 and reduces the switching loss of conventional switching amplifiers, which can only switch from high to low and not to intermediate voltages.

The driver 124 receives pulses from the PWM encoder 122 having a specific voltage and selects an appropriate voltage based on the height of the pulse. The driver selects the appropriate voltage and the transistors connected to the selected voltage are switched on and off based on the pulse widths. These voltages are then output to the speakers through the positive output and the negative output.

Figure 7:
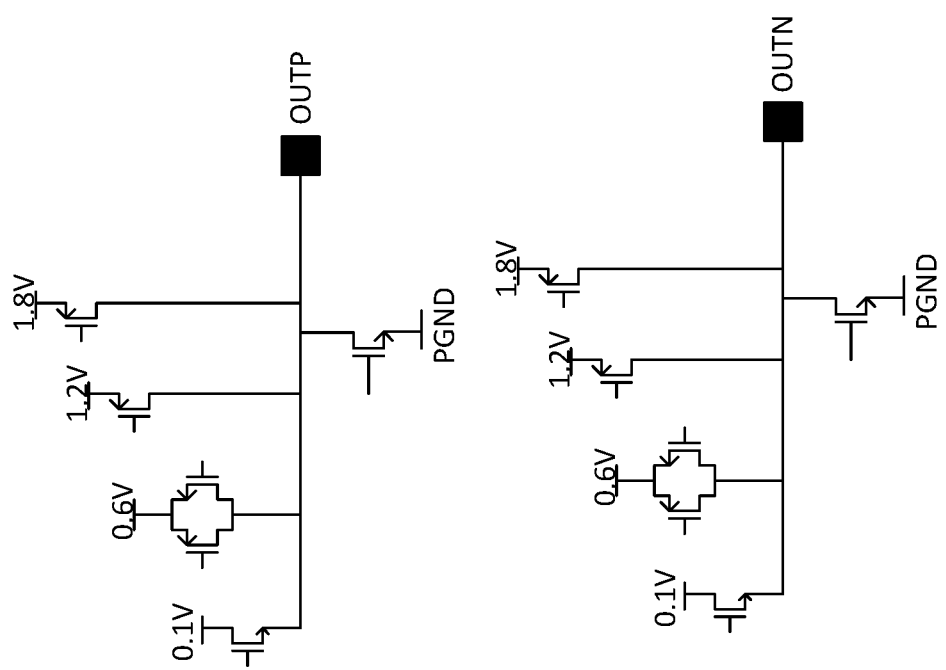
FIG. 7 is an example circuit of a portion of the driver of FIG. 1.

FIG. 7 illustrates the transistors that are modulated by the pulse widths connected to various voltages that may be selected based on the pulse height. In some embodiments, the 0.1V and the 0.6V may be output through low dropout (LDO) regulators. Although these regulators may have poor efficiency in supplying the low output voltages, the reducing in the switching loss from the low output voltages more than compensate for the LDO inefficiency and the power used is still very low, resulting in a very efficient amplifier.

The transistors for the selected voltage switch on and off in response to the various pulse lengths output by the encoder 122 to output a differential signal pair to the outputs 112 and 114, which are then sent to a speaker of a headphone.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 an amplifier, comprising a current digital-to-analog converter (DAC) configured to output a current based on a digital audio input signal; an output electrically connected to a speaker and configured to output an output signal to the speaker; a pulse width modulation (PWM) loop configured to receive an error signal, the error signal based on a difference between the current from the current DAC and a current of the output signal, and generate the output signal based on the error signal. The PWM loop includes an analog-to-digital converter (ADC) configured to receive an analog signal based on the current from the current DAC and output a digital signal representing the analog signal; and an encoder configured to receive the digital signal and output a pulse having a width based on the analog signal.

Example 2 is the amplifier of example 1, wherein the PWM loop further includes a driver, the driver including a plurality of output voltages and at least one transistor connected to each output voltage, the driver is configured to receive the pulse from the encoder and select a voltage and switch the at least one transistor connected to the selected voltage on and off based on the width of the pulse.

Example 3 is the amplifier of either one of examples 1 or 2, wherein the encoder is further configured to output the pulse having a height based on the analog signal.

Example 4 is the amplifier of example 3, wherein the PWM loop further includes a driver, the driver including a plurality of output voltages and at least one transistor connected to each output voltage, the driver is configured to receive the pulse from the encoder and select a voltage based on the height of the pulse and switch the at least one transistor connected to the selected voltage on and off based on the width of the pulse.

Example 5 is the amplifier of example 4, wherein the plurality of output voltages includes at least three output voltages.

Example 6 is the amplifier of any one of examples 1-5, wherein the PWM loop includes a loop filter, the loop filter configured to receive the error signal and amplify the error signal, and wherein the analog signal received by the SAR ADC is the amplified error signal.

Example 7 is the amplifier of example 6, wherein the loop filter is a second-order or greater loop filter.

Example 8 is the amplifier of any one of examples 1-7, wherein the encoder begins generating the pulse based on a most significant bit of the digital signal output by the ADC.

Example 9 is the amplifier of example 8, wherein the encoder begins generating the pulse based on a most significant bit of the digital signal output by the ADC before the remainder of the bits of the digital signal are output by the ADC.

Example 10 is the amplifier of any one of examples 1-9, further comprising a pulse density modulation (PDM) DAC configured to receive the digital audio signal and output a drive signal to drive the current DAC based on the digital audio signal.

Example 11 is the amplifier of any one of examples 1-10, wherein the ADC is a successive approximation register (SAR) ADC.

Example 12 is a method for converting a digital audio signal to a speaker signal, comprising converting the digital audio signal via a current digital-to-analog converter (DAC) to a current based on the digital audio signal; receiving at a loop filter an error signal, the error signaling comprising a difference between the current from the current DAC and a current of an output signal; converting the error signal into a digital signal via an analog-to-digital converter (ADC); generating a pulse signal having a plurality of pulses based on the digital signal; and outputting the output signal based on the pulse signal to a speaker of a headphone.

Example 13 is the method of example 12, wherein outputting the output signal includes selecting an output voltage from a plurality of output voltages; and switching at least one transistor connected to the selected output voltage on and off based on a width of a pulse of the pulse signal to output the output signal.

Example 14 is the method of either example 12 or 13, the method further comprising generating the pulse having a height based on the analog signal.

Example 15 is method of example 14, wherein outputting the output signal includes selecting an output voltage from a plurality of output voltages based on the height of the pulse; and switching at least one transistor connected to the selected output voltage on and off based on a width of a pulse of the pulse signal to output the output signal.

Example 16 is the method of example 15, wherein the plurality of output voltages includes at least three output voltages.

Example 17 is the method of any one of claims 12-16, further comprising receiving the error signal at the loop filter and amplifying the error signal.

Example 18 is the method of example 17, wherein the loop filter is a second-order or greater loop filter.

Example 19 is the method of any one of examples 12-18, further comprising beginning generation of the pulse based on a most significant bit of the digital signal output by the ADC.

Example 20 is the method of example 19, wherein beginning generation of the pulse includes beginning generation of the pulse based on a most significant bit of the digital signal output by the ADC before the remainder of the bits of the digital signal are output by the ADC.

Example 21 is the method of any one of examples 12-20, further comprising a receiving the digital audio signal and outputting a drive signal to drive the current DAC based on the digital audio signal.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. An amplifier comprising:
   a current digital-to-analog converter configured to output a current based on a digital audio input signal;
   an output electrically connected to a speaker and configured to provide an output signal to the speaker;
   a pulse width modulation loop configured to receive an error signal and generate the output signal based on the error signal, the error signal corresponding to a difference between the current from the current digital-to-analog converter and a current of the output signal, the pulse width modulation loop including:
   an analog-to-digital converter configured to receive an analog signal based on the error signal and output a digital signal representing the analog signal; and
   an encoder configured to receive the digital signal and output a pulse having a width based on the digital signal; and
   a driver configured to receive the pulse and provide the output signal based on the pulse.

2. The amplifier of claim 1 wherein the driver includes a plurality of output voltages and at least one transistor connected to each output voltage, the driver being configured to receive the pulse from the encoder and select a voltage and switch the at least one transistor connected to the selected voltage on and off based on the width of the pulse.

3. The amplifier of claim 1 wherein the encoder is further configured to output the pulse having a height based on the analog signal.

4. The amplifier of claim 3 wherein the driver includes a plurality of output voltages and at least one transistor connected to each output voltage, the driver being configured to receive the pulse from the encoder and select a voltage based on the height of the pulse and switch the at least one transistor connected to the selected voltage on and off based on the width of the pulse.

5. The amplifier of claim 4 wherein the plurality of output voltages includes at least three output voltages.

6. The amplifier of claim 1 wherein the pulse width modulation loop includes a loop filter, the loop filter configured to receive the error signal and amplify the error signal, and wherein the analog signal received by the analog-to-digital converter is the amplified error signal.

7. The amplifier of claim 6 wherein the loop filter is a second-order or greater loop filter.

8. The amplifier of claim 1 wherein the encoder begins generating the pulse based on a most significant bit of the digital signal output by the analog-to-digital converter.

9. The amplifier of claim 8 wherein the encoder begins generating the pulse based on a most significant bit of the digital signal output by the analog-to-digital converter before the remainder of the bits of the digital signal are output by the analog-to-digital converter.

10. The amplifier of claim 1 further comprising a pulse density modulation digital-to-analog converter configured to receive the digital audio signal and output a drive signal to drive the current digital-to-analog converter based on the digital audio signal.

11. The amplifier of claim 1 wherein the analog-to-digital converter is a successive approximation register analog-to-digital converter.

12. A method for converting a digital audio signal to a speaker signal comprising:
   converting the digital audio signal via a current digital-to-analog converter to a current based on the digital audio signal;
   receiving at a loop filter an error signal, the error signal corresponding to a difference between the current from the current digital-to-analog converter and a current of an output signal;
   converting an analog signal based on the error signal into a digital signal via an analog-to-digital converter;
   generating a pulse signal having a plurality of pulses based on the digital signal; and
   providing the output signal based on the pulse signal to a speaker of a headphone.

13. The method of claim 12 wherein providing the output signal includes:
   selecting an output voltage from a plurality of output voltages; and
   switching at least one transistor connected to the selected output voltage on and off based on a width of a pulse of the pulse signal to output the output signal.

14. The method of claim 12 the method further comprising generating the pulse having a height based on the analog signal.

15. The method of claim 14 wherein providing the output signal includes:
   selecting an output voltage from a plurality of output voltages based on the height of the pulse; and
   switching at least one transistor connected to the selected output voltage on and off based on a width of a pulse of the pulse signal to output the output signal.

16. The method of claim 15 wherein the plurality of output voltages includes at least three output voltages.

17. The method of claim 12 further comprising receiving the error signal at the loop filter and amplifying the error signal.

18. The method of claim 17 wherein the loop filter is a second-order or greater loop filter.

19. The method of claim 12 further comprising beginning generation of the pulse based on a most significant bit of the digital signal output by the analog-to-digital converter.

20. The method of claim 19 wherein beginning generation of the pulse includes beginning generation of the pulse based on a most significant bit of the digital signal output by the analog-to-digital converter before the remainder of the bits of the digital signal are output by the analog-to-digital converter.

21. The method of claim 12 further comprising a receiving the digital audio signal and outputting a drive signal to drive the current digital-to-analog converter based on the digital audio signal.

\* \* \* \* \*